(12) United States Patent
Jeng et al.

(10) Patent No.: US 6,380,068 B2
(45) Date of Patent: Apr. 30, 2002

(54) METHOD FOR PLANARIZING A FLASH MEMORY DEVICE

(75) Inventors: Pei-Ren Jeng, Hsinchu; Shu Li Wu, Nantou, both of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/783,459

(22) Filed: Feb. 14, 2001

(30) Foreign Application Priority Data

Jan. 5, 2000 (TW) ........................................ 90100248 A

(51) Int. Cl.$^7$ .......................................... H01L 21/4763
(52) U.S. Cl. ........................................ 438/626; 438/697
(58) Field of Search ................................. 438/257, 626, 438/631, 634, 645, 697, 760

(56) References Cited

U.S. PATENT DOCUMENTS

| | | | |
|---|---|---|---|
| 5,272,117 A | * 12/1993 | Roth et al. | ................... 438/626 |
| 5,789,314 A | * 8/1998 | Yen et al. | ................... 438/622 |
| 6,027,950 A | * 2/2000 | Harvey et al. | ................. 438/14 |
| 6,117,760 A | * 9/2000 | Gardner et al. | ............. 438/618 |

\* cited by examiner

*Primary Examiner*—Olik Chaudhuri
*Assistant Examiner*—Hoai Pham
(74) *Attorney, Agent, or Firm*—J. C. Patents

(57) ABSTRACT

A method to planarize a flash memory device, wherein the method is applied on a substrate having a polysilicon layer and a cap layer sequentially formed thereon. Thereafter, the cap layer and the polysilicon layer are patterned to form the peripheral circuit region and the memory cell region. A dielectric layer is then formed on the substrate, covering the cap layer. A portion of the dielectric layer is further removed to expose a part of the cap layer, such that the dielectric layer above the cap layer and the dielectric layer on both sides of the cap layer become separated. A portion of the dielectric layer in the peripheral circuit region is then removed, followed by removing the cap layer, wherein the dielectric layer above the cap layer is concurrently removed to complete the planazation of the flash memory device.

16 Claims, 2 Drawing Sheets

METHOD FOR PLANARIZING A FLASH MEMORY DEVICE

CROSS-REFERENCE TO RELATED APPLICATION

This application claims the priority benefit of Taiwan application Ser. No. 90100248, filed Jan. 5, 2001.

BACKGROUND OF THE INVENTION

1. Field of Invention

This invention relates to a planarization method. More particularly, the present invention relates to a planarization method for flash memory devices.

2. Description of Related Art

Flash memory device is an electrically-erasable-programmable-read-only memory device, which has the advantages of being programmable, erasable and the ability of retaining data after the power is off. A flash memory device is thus commonly used in personal computer and electronic devices. Flash memory device is also a non-volatile memory (NVM), which has the advantages of being small in dimension, speedy data retrieval and storage, and low power consumption. Furthermore, the erasing of data in a flash memory device uses the "block-by-block" method; therefore, it also has the advantage of having faster operational speed.

The basic structure of the memory cell region of a flash memory device includes a stacked gate structure, wherein the stacked gate structure comprises a tunnel oxide layer, a floating gate, a dielectric layer, a control gate and source/drain regions in the substrate on both sides of the stacked gate structure. In addition, at the peripheral of the memory cell region is the periphery circuit region, which includes peripheral devices that are used to write, to erase or to read data in the memory cell region.

The conventional fabrication method of a flash memory device includes depositing a dielectric layer on the substrate to cover the memory cell region and the peripheral circuit region after forming the memory cell region and the peripheral circuit region at the peripheral of the memory cell region. Chemical-mechanical polishing (CMP) is then conducted to form a planarized surface.

Using the conventional CMP process to planarize a flash memory device has several disadvantages. First of all, chemical-mechanical polishing a larger area is easier to control, for example, the area of the peripheral circuit region. However, chemical-mechanical polishing a smaller area, for example, the area of the memory cell region, is difficult to control. Hence, using chemical-mechanical polishing for planarization, it is difficult to control the polishing end point for the entire device. In addition, microscratches are easily induced on the device. Moreover, using chemical mechanical polishing to planarize an area with uneven surface levels, for example, the shallow trench isolation region, would easily have the polished debris remaining in the area.

SUMMARY OF THE INVENTION

The invention provides a method to planarize the flash memory device. The method does not require the application of chemical-mechanical polishing to accomplish the planarization of the flash memory device. The various disadvantages of chemical-mechanical polishing are thus prevented.

The present invention provides a planarization method for a flash memory device, wherein this method includes forming sequentially a polysilicon layer and a cap layer on a substrate. Thereafter, the cap layer and the polysilicon layer are patterned to form the peripheral circuit region and the memory cell region. A dielectric layer is then formed the cap layer and then etched to expose a part of the cap layer, such that the dielectric layer above the cap layer and the dielectric layer on both sides of the cap layer becomes separated. A portion of the dielectric layer in the peripheral circuit region is further removed. Subsequently the cap layer is removed and concurrently removed the dielectric layer above the cap layer to complete the planazation of the flash memory device.

According to the present invention, the planarization of a flash memory device is accomplished by etching. The common problem, encountered in chemical-mechanical polishing, such as controlling the polishing end point, is prevented.

The present invention employs the etching technique to accomplish the planarization of a flash memory device. The common problem, such as having polished debris remaining in areas with uneven surface levels, is prevented The present invention employs the etching technique to accomplish the planarization of a flash memory device. The common problem, such as forming microscratches and damaging the polished surface, is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1E are schematic, cross-sectional views, illustrating successive steps for the planarization of a flash memory device according to one preferred embodiment of this invention.

Figure 1A:
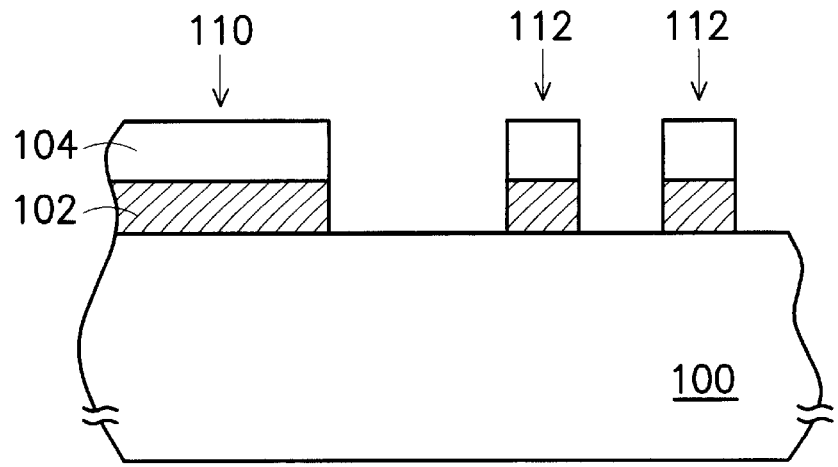
FIGS. 1A through 1E are schematic, cross-sectional views, illustrating successive steps for the planarization of a flash memory device according to one preferred embodiment of this invention.

Referring to FIG. 1A, a substrate 100 is provided. A polysilicon layer 102 of about 1000 angstroms thick is formed on the substrate 100. A cap layer 104 of about 2000 angstroms thick is then formed on the polysilicon layer 102. The material used for the cap layer 104 includes silicon nitride. Photolithography and etching are performed to pattern the cap layer 104 and the polysilicon layer 102 to form a peripheral circuit region 110 and a memory cell region 112.

Figure 1B:
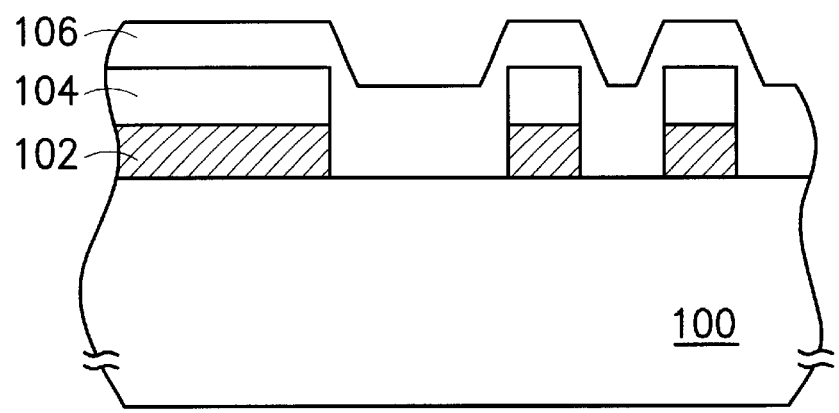

As shown in FIG. 1B, a dielectric layer 106 is formed on the substrate 100, covering the cap layer 104. The dielectric layer 106, such as a silicon dioxide layer, of about 2000 angstroms thick is formed by, for example, High Density Plasma Chemical Vapor Deposition (HDP-CVD).

Figure 1C:
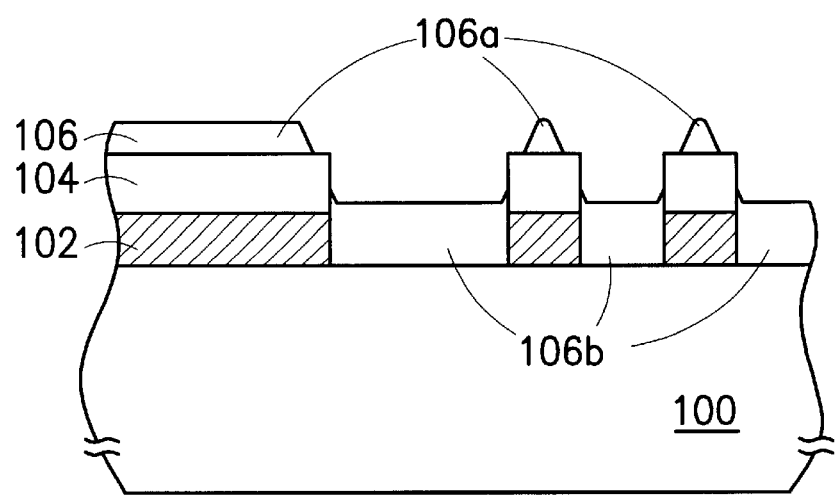

Continuing to FIG. 1C, a portion of the dielectric layer 106 is removed to expose a part of the cap layer 104. To remove the portion of the dielectric layer 106 includes wet etching the dielectric layer 106 such that the dielectric layer 106a above the cap layer 104 and the dielectric layer 106b on both sides of the cap layer 104 becomes separated. Removing the portion of the dielectric layer 106 is accomplished by having a high etching selectivity ratio between the dielectric layer 106a and the cap layer 104. For example, if the dielectric layer 106 is silicon dioxide and the cap layer is silicon nitride, a portion of the dielectric layer 106 can be removed to partially expose the cap layer and to separate the dielectric layer 106a above the cap layer 104 from the dielectric layer 106b on both sides of the cap layer 104.

Figure 1D:
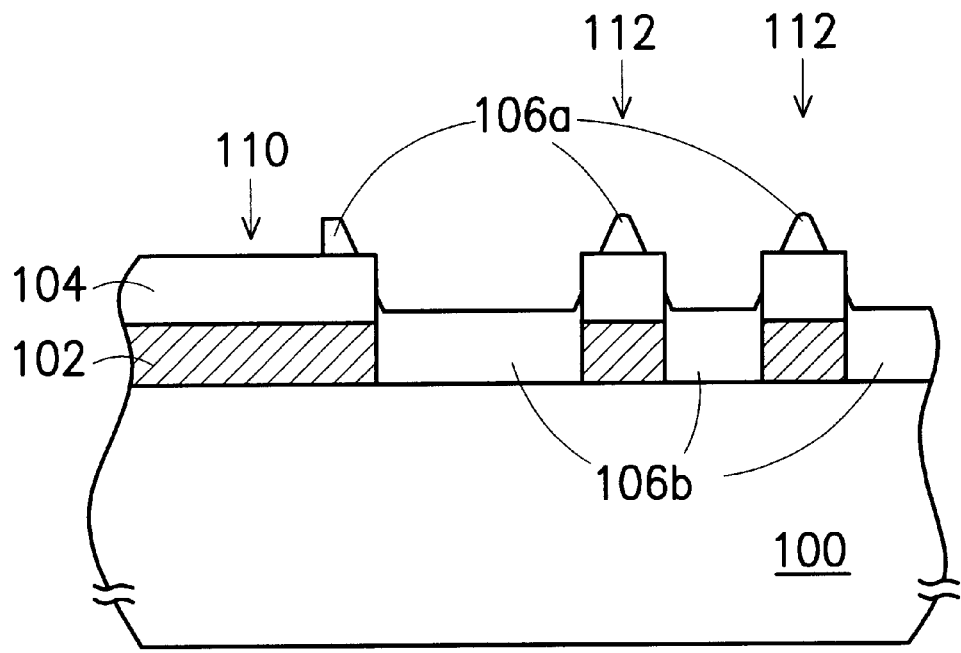

Thereafter, as shown in FIG. 1D, a portion of the dielectric layer 106a in the peripheral circuit region 110 is removed to expose a part of the cap layer 104 in the peripheral circuit region 110. The dielectric layer 106a in the memory cell region 112 and a portion of the dielectric layer 106a in the peripheral circuit region 110 are retained. The portion of the dielectric layer 106a in the peripheral circuit region 110 is removed by, for example, photolithography and etching.

Figure 1E:
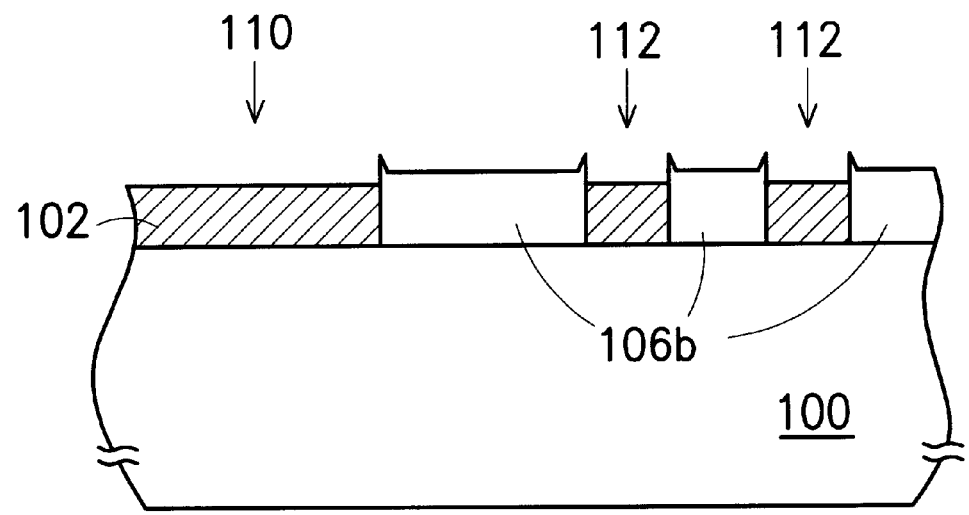

Continuing to FIG. 1E, the cap layer 104 is removed and the dielectric layer 106 above the cap layer 104 is concurrently removed to form a planarized surface among the peripheral circuit region 110, the memory cell region 112 and dielectric layer 106b. The planarization of the flash memory device is thus completed. The cap layer 104 is removed, for example, by using hot phosphoric acid.

According to the present invention, the planarization of a flash memory device is accomplished by etching. The common problem encountered in chemical-mechanical polishing, such as controlling the polishing end point, is prevented.

The present invention employs the etching technique to accomplish the planarization of a flash memory device. The common problem encountered in chemical-mechanical polishing, such as having the cap layer debris remaining in areas with uneven surface levels, is prevented.

The present invention employs the etching technique to accomplish the planarization of a flash memory device. The common problem encountered in chemical-mechanical polishing, such as forming microscratches and damaging the device surface, is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for planarizing a flash memory device, comprising:
   providing a substrate;
   forming a polysilicon layer on the substrate;
   forming a cap layer on the polysilicon layer;
   patterning the cap layer and the polysilicon layer to form a peripheral circuit region and a plurality of memory cell regions;
   forming a dielectric layer on the substrate to cover the cap layer;
   removing a portion of the dielectric layer to expose a part of the cap layer such that the dielectric layer above the cap layer and dielectric layer on both sides of the cap layer become separated; and
   removing the cap layer, wherein the dielectric layer above the cap layer is concurrently removed.

2. The method of claim 1, wherein forming the dielectric layer includes using high density plasma chemical vapor deposition.

3. The method of claim 1, wherein the dielectric layer includes silicon dioxide.

4. The method of claim 1, wherein the dielectric layer is about 1500 angstroms to 3500 angstroms thick.

5. The method of claim 1, wherein removing the portion of the dielectric layer to expose a part of the cap layer includes weting etching.

6. The method of claim 1, wherein removing the cap layer, wherein the dielectric layer above the cap layer is concurrently removed, includes using hot phosphoric acid.

7. The method of claim 1, wherein the cap layer includes silicon nitride.

8. The method of claim 1, wherein an etching selectivity ratio between the cap layer and the dielectric layer is high.

9. A planarizing method, comprising:
   providing a substrate;
   forming a first device and a second device that comprise a cap layer on a top on the substrate, wherein an area of the first device is bigger than an area of the second device;
   forming a dielectric layer on the substrate, wherein the first dielectric layer also covers the cap layer;
   removing a dielectric layer on the substrate, covering the cap layer;
   removing a portion of the dielectric layer to expose a part of the cap layer such that the dielectric layer above the cap layer and the dielectric layer on both sides of the cap layer become separated;
   removing a portion of the dielectric layer in the first device; and
   removing the cap layer such that the dielectric layer above the cap layer is concurrently removed.

10. The method of claim 9, wherein forming the dielectric layer includes performing high density plasma chemical vapor deposition.

11. The method of claim 9, wherein the dielectric layer includes silicon dioxide.

12. The method of claim 9, wherein the dielectric layer is about 1500 angstroms to about 3500 angstroms thick.

13. The method of claim 9, wherein removing the portion of the dielectric layer to expose the part of the cap layer includes wet etching.

14. The method of claim 9, wherein removing the cap layer such that the dielectric layer above the cap layer is concurrently removed includes using hot phosphoric acid.

15. The method of claim 9, wherein the cap layer includes silicon nitride.

16. The method of claim 9, wherein an etching selectivity ratio between the cap layer and the dielectric layer is high.

* * * * *